United States Patent
Wiesmann et al.

(10) Patent No.: US 7,361,377 B2
(45) Date of Patent: Apr. 22, 2008

(54) FLUORINATED PRECURSORS OF SUPERCONDUCTING CERAMICS, AND METHODS OF MAKING THE SAME

(75) Inventors: Harold Wiesmann, Stony Brook, NY (US); Vyacheslav Solovyov, Rocky Point, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 19 days.

(21) Appl. No.: 10/622,843

(22) Filed: Jul. 18, 2003

(65) Prior Publication Data

US 2005/0014032 A1   Jan. 20, 2005

(51) Int. Cl.
*B05D 5/12* (2006.01)
*H01L 39/24* (2006.01)

(52) U.S. Cl. .......... 427/62; 505/434; 505/447; 505/473; 505/477; 427/377; 427/421.1; 427/569; 29/599

(58) Field of Classification Search ........ 427/62, 427/377, 421.1, 569; 29/599; 204/192.24; 505/434, 447, 473, 477

See application file for complete search history.

(56) References Cited

U.S. PATENT DOCUMENTS

| | | | | |
|---|---|---|---|---|
| 4,913,769 A | * | 4/1990 | Kanda et al. | 216/18 |
| 4,962,085 A | * | 10/1990 | deBarbadillo et al. | 505/500 |
| 4,992,415 A | * | 2/1991 | Ashok et al. | 505/413 |
| 5,081,103 A | * | 1/1992 | Gressler et al. | 505/461 |
| 5,132,281 A | * | 7/1992 | Chevallier et al. | 505/461 |
| 5,231,074 A | | 7/1993 | Cima et al. | |
| 5,520,953 A | * | 5/1996 | Ovshinsky et al. | 427/62 |

2003/0050195 A1   3/2003   Wiesmann et al.

FOREIGN PATENT DOCUMENTS

EP   286135   *   4/1988
JP   64-57685   *   3/1989

OTHER PUBLICATIONS

Author: Chan et al.; Title: "Effect of the Post-Deposition Processing Ambient on the Preparation of Superconducting $YBa_2Cu_3O_{7-x}$ Coevaporated Thin Films Using a $BaF_2$ Source;" Publication: *Appl. Phys. Lett.* 53(15): 1443-1445; Date of Publication: Oct. 1988.

Author: Solovyov et al.; Title: "Ex-situ Post-deposition Processing for Large Area $YBa_2Cu_3O_7$ Films and Coated Tapes;" Publication: *IEEE Transactions on Applied Superconductivity* 11(1):2939-2942; Date of Publication: Mar. 2001.

Author: Solovyov et al.; Title: "Thick $YBa_2Cu_3O_7$ Films by Post Annealing of the Precursor by High Rate E-beam Deposition on $SrTiO_3$ Substrates;" *Physica C.* 309:269-274; Date of Publication: Dec. 1998.

Author: Solovyov et al.; Title: "High Rate Deposition of 5 Micron Thick $YBa_2Cu_3O_7$ Films using the $BaF_2$ Ex-Situ Post Annealing Process;" Publication: *IEEE Transactions on Applied Superconductivity* 9(2):1467-1470; Date of Publication: Jun. 1999.

Author: Solovyov et al.; Title: "Growth rate limiting mechanisms of $YBa_2Cu_3O_7$ films manufactured by ex situ processing;" Publication: *Physica C.* 353:14-22; Date of Publication: 2001.

* cited by examiner

*Primary Examiner*—Brian K. Talbot
(74) *Attorney, Agent, or Firm*—Lori-Anne Neiger

(57) ABSTRACT

This invention provides a method of making a fluorinated precursor of a superconducting ceramic. The method comprises providing a solution comprising a rare earth salt, an alkaline earth metal salt and a copper salt; spraying the solution onto a substrate to provide a film-covered substrate; and heating the film-covered substrate in an atmosphere containing fluorinated gas to provide the fluorinated precursor.

25 Claims, No Drawings

FLUORINATED PRECURSORS OF SUPERCONDUCTING CERAMICS, AND METHODS OF MAKING THE SAME

This invention was made with Government support under Contract No. DE-AC02-98CH10886 awarded by the U.S. Department of Energy. The Government has certain rights in this invention.

BACKGROUND OF THE INVENTION

The present invention relates to the production of fluorinated precursors of superconducting ceramics, and superconducting ceramic powders obtained therefrom. In particular, the invention relates to producing oxide superconductors of the rare earth-alkaline earth metal-cuprate family of superconductors, such as $YBa_2Cu_3O_y$ (YBCO) films and coatings.

The discovery of superconducting ceramic powders has fueled a tremendous effort to fabricate these powders into high performance films and coatings. These films and coatings can be used to cover articles, i.e. tapes, wires, wafers, etc., for the fabrication of superconducting end use products.

Current density ($J_C$), also known as critical current, is a key property by which to evaluate the quality of a superconductor. Current density is a vector quantity whose magnitude is the ratio of the magnitude of current flowing in a conductor to the cross-sectional area perpendicular to the current flow. A main challenge in the art is the production of superconducting ceramics which exhibit high current densities.

The precursors of superconducting ceramics are typically grown on supporting materials, termed substrates. Substrates can range from being a single crystal to being a whole article, i.e. tape, wire, etc. The particular substrate upon which a precursor is grown, and the particular conditions such growth takes place, significantly determine the current density that a superconducting ceramic will exhibit.

In general, to achieve a high current density, a precursor is grown on a substrate that allows for oriented crystalline growth, i.e. epitaxial growth, and that primarily produces crystalline superconductors with low angle grain boundaries. (Typically, the precursor and the substrate are chemically dissimilar; thus, the epitaxial growth of the precursor is termed heteroepitaxial.)

Single crystalline structures, and in particular single crystals, allow for better epitaxial growth and thus provide higher current densities vis-à-vis polycrystalline structures. For example, YBCO films, grown on epitaxial single crystals, have exihibited critical current densities of $4 \times 10^6$ amps/cm$^2$ at 77K. In contrast, critical current densities are drastically reduced when YBCO films are grown on polycrystalline structures. In such cases, crystal grain boundaries are, for example, increased thereby producing "weakly linked" crystalline structures.

It has been found that the inclusion of fluorine into the precursors of superconducting ceramics allows for the production of superconducting ceramics with high current densities. It is thought that fluorine enhances the transfer of the crystalline order of a substrate to the growing ceramic precursor, i.e. enhances epitaxial growth.

Prior to the present invention, techniques by which to include fluorine during the growth of ceramic precursors could be broadly divided into two categories. These categories are physical deposition methods and chemical methods.

Physical deposition methods include reactive evaporation, magnetron sputtering, e-beam deposition and laser ablation. Typically, in these methods, fluorine is introduced into a precursor film as barium fluoride. Although these methods form high quality films, these methods require high vacuum environments. Such environments require expensive equipment. Moreover, these methods have very slow formation rates which also adds to the expense and inconvenience of making these precursor films. In addition, physical deposition methods are extremely difficult to scale up to multi-meter lengths which are required for electrical or magnetic applications. Instead, such methods are best suited for thin-film fabrication.

Chemical methods are largely based upon thermally activated chemical reactions of precursor compounds during film formation. A precursor is deposited onto a substrate, and later transformed through chemical reactions. Typically, in these methods, fluorine is introduced into the precursor film as solutions containing trifluoroacetates. Such trifluoroacetates solutions are costly.

An example of a chemical method that is widely used in industry is metalorganic chemical vapor deposition (MOCVD). Ceramic precursor films can be deposited from metalorganic precursors having a high vapor pressure. The precursor film is then heated and converted into the final ceramic in a separate heat treatment.

While MOCVD is a versatile and inexpensive method of film fabrication with potential for high speed production, this method is very sensitive to secondary reactions which may be deleterious to final superconducting properties. For example, in the deposition of materials such as $YBa_2Cu_3O_y$, such processes are highly susceptible to the intermediate formation of barium carbonate ($BaCO_3$). High processing temperatures (>900° C.) and extended processing times are required in order to decompose the barium carbonate and obtain the final superconductor. Such extreme reaction conditions result in reactions between the film and the substrate resulting in poor quality films.

Recently, U.S. Pat. No. 5,231,074 issued to Cima et al. described the metal-organic solution deposition (MOD) preparation of $Ba_2YCu_3O_{7-x}$, superconductor films having improved electrical transport properties. In this method, the deposition is done using metal trifluoroacetates on a single crystal of $SrTiO_3$ or $LaAlO_3$. Films with thicknesses of about 0.1 µm, and critical current densities of greater than $10^6$ A/cm$^2$ at 77 K were described. However, the superconducting performance of $YBa_2Cu_3O_{7-x}$ films prepared using this process has been found to depend on film thickness. In particular, electrical performance drops off dramatically as film thickness increases from 0.1 µm to 5.0 µm. Thus, the applications of such processes are limited.

A hybrid process, known as an ex situ process, combines physical deposition and chemical methods. In particular, this process includes the physical deposition of a precursor film which is then processed outside of the physical deposition chamber by conventional chemicothermal processes (Chan et al. *Appl. Phys. Lett.* 53(15):1443 (October 1988)). This process involves uniform codeposition of CuO, $Y_2O_3$, and $BaF_2$ in the correct stoichiometric ratio onto a substrate. The precursor film is then converted under conventional heating conditions into the superconductor by annealing in the presence of water vapor. However, the limitations of physical deposition methods described above remain.

Accordingly, there is a need in the art for a method to produce superconducting ceramic powders, and their precursors, which is more convenient and less costly than current methods. In particular, there is a need for processes that eliminate the high cost of physical deposition. Additionally, there is a need for a fluorination process that uses simple equipment and eliminates the need for expensive trifluoroacetates. Further, there is a need for a method of producing superconducting ceramics in which cracking in the ceramic is reduced. Also, there is a need for a convenient cost effective process by which to produce superconducting ceramics of various thicknesses.

SUMMARY OF THE INVENTION

The invention provides methods of making fluorinated precursors of superconducting ceramics of the rare earth-alkaline earth metal-cuprate family of superconductors, such as $YBa_2Cu_3O_y$, films and coatings.

In one embodiment, the method comprises providing a solution comprising a rare earth salt, an alkaline earth metal salt and a copper salt. The solution is sprayed onto a substrate to provide a film-covered substrate. The film-covered substrate is heated in an atmosphere containing fluorinated gas to provide the fluorinated precursor.

In another embodiment, the method comprises providing a solution of a rare earth salt, an alkaline earth metal salt and a copper salt. The solution and fluorinated gas is sprayed onto a substrate to provide the fluorinated precursor.

In the methods, preferably the solution is dispersed in a carrier gas before spraying onto the substrate. The carrier gas comprises an inert gas, such as, for example, nitrogen, argon, helium and mixtures thereof. Preferably, the carrier gas further comprises oxygen.

Examples of rare earth salts include yttrium (Y) salt, a neodymium (Nd) salt, a, a ytterbium (Yb) salt, an europium (Eu) salt, a gadolinium (Gd) salt, a dysprosium (Dy) salt, a holmium (Ho) salt, an erbium (Er) salt, a lanthanum (La) salt, a lutetium (Lu) salt, a samarium (Sm) salt, a thulium (Tm) salt, and mixtures thereof.

Examples of salts of an alkaline earth metal include magnesium (Mg) salt, a calcium (Ca) salt, a strontium (Sr) salt and a barium (Ba) salt and mixtures thereof.

Examples of substrates include a single crystalline ceramic, polycrystalline ceramic, a single crystal and a metal. Further examples are $SrTiO_3$, $LaAlO_3$, zirconia, $CeO_2$, $Y_2O_3$, MgO, and $SrRuO_3$.

Examples of fluorinated gases include $CHF_3$, $CH_2F_2$, $CH_3F$, $CHF_2CHF_2$ (HFC 134), $CHF_2CF_3$ (HFC 125), $CHF_2CH_3$ (HFC 152a), $CF_3CH_2F$ (HFC 134a), $CH_3CF_3$, $CH_2FCH_3$, $CHF_2$, $CH_2F$, $CH_2FCH_2F$, $CF_3CH_2CF_3$ (HFC 236fa), a fluorinated propane, a fluorinated propylene, a fluorinated ethylene and mixtures thereof.

The fluorinated precursor can be transformed into a crystalline superconducting ceramic comprising a rare earth salt, an alkaline earth metal salt and a copper salt. An example of such ceramic is $YBa_2Cu_3O_y$ films and coatings. The superconducting ceramic has a critical current density measured at 77 K of about 0.1 $MA/cm^2$ or greater in zero magnetic field.

In another embodiment, a method of increasing the quality of a precursor film is provided. The method comprises heat treating a precursor film at atmospheric or sub-atmospheric pressure in the presence of fluorinated gas and oxygen to produce a resultant precursor film. The resultant precursor film can further to heated in an atmosphere comprising nitrogen, water vapor and oxygen at atmospheric or sub-atmospheric pressure to produce a crystalline film.

In another embodiment, a method of inhibiting the conversion of a fluorinated precursor film into a crystalline film is provided. The film comprises rare earth metal, alkaline earth metal cuprate. The method comprises adding a small amount of fluorinated gas during a heat treatment process by which a precursor film is to be converted into a crystalline film.

The methods of producing fluorinated precursors of superconducting ceramics provided by the present invention provide several advantages over current methods.

Prior art methods of fluorination include physical vapor deposition where fluorine is introduced as barium fluoride, or chemical processes whereby fluorine is added from solutions containing trifluoroacetates.

The methods of the present invention use simple equipment at atmospheric or sub-atmospheric pressure, and inexpensive fluorine sources, to provide fluorinated ceramic precursor films. The fluorination step requires only a few Torr pressure and an inexpensive fluorine-containing gas, e.g., HFC134a ($CF_3CH_2F$). Additionally, the fluorination reaction is very fast, on the order of a few minutes. The need for physical vapor deposition, a costly and very capital intensive endeavor, is eliminated in the methods of the present invention. Also, the fluorine sources used in the present methods are less costly than fluorination using trifluoroacetates.

In the embodiment in which fluorination takes place along with the spraying of the precursor onto the substrate, the need for vacuum fluorination is eliminated. Additionally, in this embodiment of the present invention, cracking in thick crystalline films is reduced.

Additionally, since the methods of the invention does not use a high oxygen pressure during the fluorination of precursor films, a greater selection of substrates can be used. For example, substrates which are relatively oxygen sensitive, such as tungsten, copper, chromium and/or nickel, can be used as substrates.

DETAILED DESCRIPTION OF THE INVENTION

The present invention provides fluorinated precursors of superconducting ceramics, superconducting ceramics, and methods of making the same.

The superconducting ceramics, and their precursors, produced by the methods of the present invention include oxide superconductors of the rare earth-alkaline earth metal-cuprate family of superconductors (ReAeCO), where Re are rare earth elements; and Ae are alkaline earth metal elements. More preferably, the precursors comprise the rare earth-barium-cuprate family (ReBCO). In the most preferred embodiment, the rare earth-barium-cuprate is $YBa_2Cu_3O_y$, (YBCO), where y is a value sufficient to impart superconductivity at temperatures of at least 77 K. The value of y is dependent on the process conditions used to produce a particular cuprate superconductor. Typically the value of y is seven.

In the methods of the invention, the constituents of the precursors are provided in the form of salts (a rare earth salt, an alkaline earth metal salt, and a copper salt) in an aqueous solution.

For example, salts of the precursor constituents can be dissolved in acidic or non-acidic water to provide a precursor solution. It is preferable to use an acidic aqueous solution when, for example, dissolving carbonate salts. The acidic aqueous solution has a pH of from about 1 to 5, more preferably from about 1 to 3. Such an acidic solution can be prepared, for example, by the addition of an acid, such as nitric acid, to water. The precursor solutions can also be comprised of water and alcohol or other suitable solvents, as is known to one skilled in the art.

The relative amounts, i.e. the stoichiometric ratio, of the precursor salts in the precursor solution depend on the process used to apply the precursor to a substrate, as would be known to one skilled in the art; and depends on the desired ratio in the final ceramic. For example, depending upon process conditions, the stoichiometric ratio of Y:Ba:Cu in the precursor solution can range from about 1:2:0.5 to 1:2:3.5.

The rare earth salt can be any rare earth salt, or combination of rare earth salts. For the purposes of this specification, in addition to lanthanide series, the rare earth elements also include yttrium (Y) and scandium (Sc). Preferably, the rare earth salt is a salt of yttrium (Y), neodymium (Nd), samarium (Sm), europium (Eu), gadolinium (Gd), dysprosium (Dy), holmium (Ho), erbium (Er), thulium (Tm), lanthanum (La), Lutetium (Lu) or ytterbium (Yb). More preferably, the rare earth salt is a yttrium salt.

The rare earth salt can be any salt of a rare earth, provided the salt is soluble. Examples of rare earth salts include nitrates, sulfates, bicarbonates, acetates, chlorides and mixtures thereof. Preferably, the rare earth salt is a rare earth nitrate, more preferably a yttrium nitrate.

The salt of an alkaline earth metal can be any an alkaline earth metal salt, or combination of alkaline earth metal salts. Preferably, the alkaline earth metal salt is a salt of magnesium (Mg), calcium (Ca), strontium (Sr) or barium (Ba). Preferably, the alkaline earth metal salt is barium salt.

The alkaline earth metal salt can be any salt of an alkaline earth metal. Examples of such salts include nitrates, sulfates, carbonates, acetates, chlorides or mixtures thereof,. Preferably, the alkaline earth metal salt is barium salt. Preferably, the barium salt is a barium nitrate.

The copper salt can be any salt of copper. Examples of such salts include copper nitrates, copper acetates, copper sulfates, copper sulfides, copper chlorides and mixtures thereof. Preferably, the copper salt is copper nitrate.

In one embodiment, the precursor solution is placed onto a substrate to form a precursor film/covering on the substrate, i.e. a film-covered substrate. The substrate can be coated with a buffer layer prior to the placement of the precursor solution.

The precursor solution is preferably placed onto a substrate by spraying ultrafine particles of the solution onto the substrate. These particles are dispersed so that they cover and adhere to the surface of a suitable substrate or buffer-coated substrate. These ultrafine particles can be created by aerosol spray, by evaporation or by similar techniques, preferably techniques which allow adjustment of the size of the particles. The ultrafine particles are less than about 500 nm, preferably less than about 250 nm, more preferably less than about 100 nm, and even more preferably less than about 50 nm. In general, the size of the particles is less than about 50% of the desired final covering thickness, preferably less than about 30%, and most preferably less than about 10% of the desired final covering thickness.

Preferably, ultrafine particles of the precursor solution are formed by the following method. The precursor solution is placed into an enclosed vessel which has an inlet and an outlet. A fine mist is formed from the precursor solution. The mist can be formed by, for example, evaporation or by an atomizer, such as an ultrasonic crystal. A carrier gas is then injected into the inlet of the vessel whereby the mist mixes with the carrier gas and exits from the vessel outlet as a spray. The carrier gas is any gas or mixture of gases which enables the mist to form a spray, and which does not deleteriously affect the precursor solution. Examples of suitable gases include inert gases, such as nitrogen, argon, helium, and mixtures thereof Inert gases mixed with oxygen are also suitable. For example, the mixture can comprise 60 vol %, 70 vol %, 80 vol % or 90 vol % of an inert gas, with the balance being oxygen. Preferably, the carrier gas comprises a mixture of nitrogen and oxygen.

The spray, comprising the mist and the carrier gas, is directed at the substrate. Preferably, the substrate is heated to a temperature of about 400° C. to 800° C. before receiving the spray. Examples of lower boundaries of this range are about 400° C., 500° C. and 630° C. Examples of upper boundaries of this range are about 650° C., 700° C. and 800° C.

The rate of coverage of a substrate varies with different process conditions. In one embodiment, the spray, as described above, covers a single crystal substrate (having approximate size of 3 mm by 10 mm by 0.5 mm) with a one micrometer thick precursor film/covering in about one hour. In another embodiment, the spray is subjected to a high voltage Corona discharge before, and/or while, the spray is directed at the substrate. In this embodiment, the same crystal would be covered with a one micrometer thick precursor film/covering in about five to fifteen minutes, such as, for example about ten minutes.

Depending upon the particular process conditions used in preparing the precursor films/coverings, the relative amounts of the cations in the precursor solutions are preferably varied in order to obtain a desired ratio of rare earth metal to alkaline earth metal to copper in the final precursor film/covering. For example, in order to obtain a precursor film/covering comprising Y:Ba:Cu in a ratio of 1:2:3, the ratio of Y:Ba:Cu in the precursor solution is preferably varied depending upon whether the precursor spray is subjected to a Corona discharge. In particular, if the spray is not exposed to a Corona discharge, the Y:Ba:Cu cation ratio is preferably about 1:2:0.5. If the spray is exposed to a Corona discharge, the Y:Ba:Cu cation ratio is preferably about 1:2:3.5.

Spraying is continued until a desired thickness of the precursor film/covering is reached. The thickness is determined by the type of substrate and the desired end use application, as is known by one skilled in the art.

The precursor film/covering is then fluorinated by exposure to fluorinated gas. Before exposure, the film/covering is preferably heated to accelerate the evaporation of the water of the solution. The exposure to fluorinated gas comprises heating in an atmosphere containing a fluorinated gas. Preferably oxygen is also included in the atmosphere. The fluorinated gas reacts with the precursor film/covering; and fluorine is transferred from the gas to the precursor.

The exposure to fluorinated gas takes place at atmospheric or sub-atmospheric pressure. In particular, the pressure of the fluorinated gas is in the range of about 3 to 760 Torr. Examples of lower boundaries of this range include about 3 Torr, 4 Torr, 100 Torr, 200 Torr and 300 Torr. Examples of upper boundaries of this range include about 400 Torr, 500 Torr, 600 Torr and 760 Torr. The temperature to which the atmosphere is heated is in the range of about 300° C. to about 900° C. Examples of lower boundaries of this range include about 300° C., 400° C., 500° C. and 600° C. Examples of upper boundaries of this range include about 600° C., 700° C., 800° C. and 900° C.

Preferably, the atmosphere containing fluorinated gas is subject to an electrical discharge. The electrical discharge can be a direct current discharge, an alternating frequency discharge or a combination thereof. The electrical discharge increases the reactivity of the gases. The electrical discharge can be performed at a pressure range of about 10 milliTorr to 200 Torr. If the electrical discharge is a high voltage electrical discharge, the pressure of the system can be atmospheric pressure.

In another embodiment of the present invention, the precursor solution is fluorinated before the precursor solution is placed onto the substrate. For example, the precursor solution is exposed to fluorinated gas prior to placement on the substrate.

In this embodiment, as described above, the precursor solution is preferably placed into an enclosed vessel which has an inlet and an outlet; and a fine mist is formed from the precursor solution. A carrier gas is then injected into the inlet of the vessel whereby the mist mixes with the carrier gas and exits from the vessel outlet as a spray. The carrier gas is any gas or mixture of gases which enables the mist to form a spray, and which does not deleteriously affect the precursor solution, as described above. In addition to the carrier gas, the mist is also exposed to a fluorinated gas.

The fluorinated gas can be mixed with the carrier gas, or can be injected into the vessel separately. Preferably, oxygen is injected along with the fluorinated gas. The fluorinated gas can be injected at the same rate as the carrier gas, or at a different rate than the carrier gas. Preferably, the fluorinated gas is injected at a slower rate than the carrier gas. For example, the fluorinated gas can be injected at about 1/10 to 1/40 the rate of the carrier gas, such as, for example, at a rate of about 1/30 of the rate of the carrier gas. For instance, if the carrier gas is injected at a rate of about 5 to 15 liters per minute; the fluorinated gas is injected at a rate of about 0.17 to 0.50 liters per minute. The carrier gas and the fluorinated gas can be injected simultaneously or sequentially. This embodiment is preferably carried out at room temperature and atmospheric pressure. The spray can be subjected to high voltage Corona discharge, as described above.

The spray, which comprises the mist, the carrier gas and the fluorinated gas, is directed at the substrate. Preferably, the spray is subject to an electrical discharge, as described above. Preferably, the substrate is heated prior to receiving the spray, as described above.

In the methods of fluorination of the present invention, the fluorinated gas can be any gaseous molecules which comprise carbon, hydrogen and fluorine, such as $CHF_2CHF_2$ (HFC 134), $CHF_2CF_3$ (HFC 125), $CHF_2CH_3$ (HFC 152a), $CF_3CH_2CF_3$ (HFC 236fa), $CHF_3$, $CH_2F_2$, $CH_3F$, $CH_3CF_3$, $CH_2FCH_3$, $CHF_2CH_2F$, $CH_2FCH_2F$, fluorinated propane, fluorinated propylene, fluorinated ethylene and $CF_3CH_2F$ (HFC 134a). A mixture of different fluorinated gases can also be used. Preferably, the fluorinated gas is a hydrofluorocarbon. An example of a preferred hydrofluorocarbon is $CF_3CH_2F$. The fluorinated gas is preferably used in conjunction with a small amount of oxygen. When fluorination takes place at subatmospheric pressure, a small amount of oxygen can be used, such as, for example, about 50 to 200 milliTorr. When fluorination takes place at atmospheric pressure, a greater amount of oxygen can be used, such as, for example, about 760 Torr.

After the precursor covering is fluorinated by any of the methods of the invention, the precursor covering is converted into a crystalline superconductor. In one embodiment, the conversion comprises heating the fluorinated precursor covering and exposing to an atmosphere of water vapor and oxygen. In particular, the fluorinated precursor covering is heated at a temperature of about 500° C. to 800° C., in the presence of oxygen, water vapor and optionally a carrier gas, preferably nitrogen, at sub-atmospheric pressure. This process is described in U.S. Application Publication No. 2003/0050195, which publication is incorporated herein by reference in its entirety. In another embodiment, the fluorinated precursor covering is heated at atmospheric pressure. This process is described in Solovyov et. al. "Growth rate limiting mechanisms of $YBa_2Cu_3O_7$ films manufactured by ex situ processing," Physica C., 353:14 (2001). After heating by any method, the crystalline superconductor is preferably annealed in oxygen to optimize the superconducting properties. The superconducting coverings, obtained from these methods, contain only trace amounts of fluorine.

The thicknesses of the superconducting coverings vary depending on the end use application of the covering, as known by a skilled artisan. For example, YBCO films, range in thickness from about 0.05 to about 10 microns. The fluorination method in which fluorine is applied during spraying enables the production of relatively thicker films while minimizing the development of cracks in the films during the crystallization of the precursor.

Substrates provide support upon which the superconducting precursor grows. The substrate can be any material which is not deleteriously affected by the processing conditions and chemicals used to prepare the superconducting ceramics of the present invention. Preferably, the substrate has a low Curie temperature so that the substrate is not ferromagnetic at the superconducting ceramic's application temperatures. Furthermore, chemical species within the substrate preferably should not be able to diffuse into the layer of superconducting ceramic, and the coefficient of thermal expansion of the substrate preferably should be about the same as the superconducting material. Also, the substrate preferably should be relatively resistant to oxidation.

The substrate can be substantially a single crystal, single crystalline ceramic, polycrystalline ceramic or a metal. Preferably, a substrate is chosen which promotes epitaxial growth of the precursor. Examples of substrates which promote epitaxial growth include ceramic crystalline materials which have similar lattice constants with the precursor, and substrates that are substantially a single crystal which has a lattice constant which is similar to the precursor. The nucleating superconducting precursor preferentially aligns its principle axes with the principle axes of the substrate to thereby obtain ordered crystal growth and orientation of the oxide film, i.e. epitaxy. Such order results in an oxide superconductor in which each axis is substantially completely aligned. In this manner, the substrate transfers its crystalline order to the growing superconducting ceramic precursor, allowing for higher critical currents.

Without being limited to a theory, it is believed that the fluorine in the precursor film enhances the epitaxial growth of the precursor covering when the precursor covering is being converted in a crystalline superconductor.

The crystallographic orientation of most ceramic precursors is critical. For example, the ability of a YBCO to provide high transport current in its superconducting state strictly depends upon its crystallographic orientation. In particular, a YBCO superconducting ceramic can exhibit a relatively high critical current density when its surface is biaxially textured.

Biaxially textured refers to a surface for which the crystal grains are in close alignment with a direction in the plane of the surface. One type of biaxially textured surface is a cube textured surface, in which the crystal grains are also in close alignment with a direction perpendicular to the surface. Examples of cube textured surfaces include the (100)[001] and (100)[011] surfaces, and an example of a biaxially textured surface is the (113)[211] surface.

Examples of suitable crystalline substrates include, but are in no way limited to, $SrTiO_3$, $LaAlO_3$, $Y_2O_3$, zirconia, preferably stabilized zirconia, such as yttria-stabilized zirconia (YSZ), $ZrO_2$, $CeO_2$, $SrRuO_3$ and MgO.

Examples of suitable metal substrates include nickel (Ni); silver (Ag); alloys comprising Ni; and alloys comprising Ag.

Preferably, in embodiments using metal substrates, at least one buffer layer is placed between the substrate and the superconducting precursor. The buffer layer(s) can be more resistant to oxidation than the substrate, and reduce the diffusion of chemical species between the substrate and the superconductor layer. Moreover, the buffer layer(s) can have a coefficient of thermal expansion that is well matched with the superconductor material.

Typically, a buffer layer is an epitaxial layer, so its crystallographic orientation is directly related to the crystallographic orientation of the surface onto which the buffer layer is deposited. For example, in a multi-layer superconductor having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer. Therefore, the superconducting properties exhibited by a multi-layer superconductor having a buffer layer can depend upon the crystallographic orientation of the buffer layer surface.

Suitable buffer layers include but are not limited to, zirconia, $LaAlO_3$, $SrTiO_3$, $CeO_2$, MgO, $Y_2O_3$, $TbO_x$, $GaO_x$, $Gd_2O_3$, $LaNiO_3$, $LaCuO_3$, $NdGaO_3$, $NdAlO_3$, $CaF_2$, AlN, NbN, TiN, VN, ZrN, NiO, Ag, $MgF_2$, $LaMnO_3$, $La_2Zr_2O_7$, $Gd_2Zr_2O_7$, $Ba_2Zr_2O_7$ or doped compounds thereof. The bulk portion of the buffer material can have a texture selected from the group consisting of biaxial texture and cube texture.

In one embodiment of the invention, the substrate can be an article. For example, an article can be a metallic substrate selected for durability and/or flexibility, e.g., a wire, a tape, a wafer, a ribbon, etc. Preferably, an article is coated with a buffer layer which is compatible with the growing superconducting precursor. For example, the article is preferably coated with a buffer layer which contains some degree of crystallographic alignment, and which is reasonably lattice-matched with the precursor.

In one embodiment, the superconducting ceramic precursor can be produced without a substrate, i.e. produced to be free standing.

In another aspect of the present invention, a method is provided by which a fluorinated gas as described above is used to improve the quality of precursor films. The precursor film can be produced by any process. The method comprises heat treating a precursor film at atmospheric or sub-atmospheric pressure in the presence of fluorinated gas and, preferably, also in the presence of a small amount of oxygen. Heat treatment comprises heating a precursor film to a temperature of about 400° C. to about 800° C., more preferably to about 500° C. to about 700° C., optimally to about 600° C. for about a half an hour to about ten hours. For example, films about 1 micron thick are preferably heat treated for about one hour. The pressure of the fluorinated gas that the precursor films are exposed to during treatment is about 1 to 760 Torr. For example, the atmosphere can consist of 5 Torr of $CF_3CH_2F$ gas and 100 milliTorr of oxygen. Next, the film is converted into a crystalline superconducting film by heating in an atmosphere comprising an inert gas, as described above, at atmospheric or sub-atmospheric pressure. For example, the atmosphere for a fluorinated precursor film being heat treated at atmospheric pressure can consist of 50 Torr water vapor, 100 milliTorr oxygen with the balance being nitrogen. The film is heated to about 500° C. to about 900° C., preferably to about 600° C. to 800° C., optimally to about 735° C. After heat treating the crystalline superconductor is preferably annealed in oxygen to optimize the superconducting properties as is known to those skilled in the art. The improvement of the precursor film includes an increase in current density of the crystalline film formed from the precursor film.

For example, a 0.6 microns thick precursor film consisting of a mixture of $BaF_2$, Y and Cu, deposited onto $SrTiO_3$ substrate, showed an increase in critical current from about $1.1 \times 10^6$ ampere/cm$^2$ to about $1.6 \times 10^6$ ampere/cm$^2$ after treatment by the methods of the present invention.

In another aspect of the present invention, a method is provided by which to inhibit the conversion of a fluorinated precursor film into a crystalline film. The fluorinated precursor film is in the rare earth-alkaline earth metal-cuprate family, such as a YBCO film. The precursor film can be produced by any process. The method comprises adding a small amount of fluorinated gas to the atmosphere during a heat treatment process by which a fluorinated precursor film is to be converted into a crystalline film. For example, if the total pressure of a system is approximately 7 Torr, the fluorinated gas contributes approximately 10 milliTorr to the pressure. It is understood by those skilled in the art that the required fluorinated gas pressure is achieved when the chemical potential of the fluorine exiting the precursor film is equal to the chemical potential of the fluorine in the atmosphere above the film. Details can be found in the publication "Ex-situ Post-deposition Processing for Large Area $YBa_2Cu_3O_7$ Films and Coated Tapes by IEEE Transactions on Applied Superconductivity," 11(1):2939 (March 2001).

For example, approximately 10 milliTorr of HFC 134 a gas was sufficient to stop the conversion of a precursor film into crystalline $YBa_2Cu_3O_7$ This method is useful in controlling the growth of a crystalline film. By controlling the growth, a crystalline film of better quality is obtained. For example, the angle grain boundaries are minimized thereby increasing the critical current of the final superconducting film.

In another aspect of the present invention, crystalline films are converted into fluorinated precursors. The crystalline film is in the rare earth-alkaline earth metal-cuprate family, such as a YBCO film, and can be produced by any process. The crystalline film is exposed to fluorinated gas pressures in excess of about 10 milliTorr. For example, if the total pressure of the system is approximately 7 Torr, the fluorinated gas contributes approximately 50 milliTorr to the pressure.

EXAMPLES

Example 1

Preparation of a YBCO Precursor Film:
Fluorination After Precursor Solution Was Placed on Substrate An aqueous solution of nitrate salts was fabricated. Ten milliliters of nitric acid was added to 100 milliliters of distilled water. The resulting pH of the mixture was about 1. Copper oxide, yttrium oxide and barium carbonate were next dissolved into the nitric acid-water solution to form a resulting salt solution. The ratio of Y:Ba:Cu was 1:2:0.5 and the total cation concentration was about 0.01 molar.

The resulting salt solution was placed into a closed plastic vessel. The bottom of the vessel was constructed of a 10 mil thick mylar film. The bottom of the plastic vessel was placed in close contact with an ultrasonic crystal oscillating at 1.65 megahertz. The ultrasonic crystal was contained in a Devilbiss Ultra Neb model 99HD nebulizer. The mylar film was coupled to the ultrasonic crystal with water, a technique known to those skilled in the art. Power was applied to the ultrasonic crystal and a fine mist (fog) filled the plastic vessel above the salt solution. At the top of the plastic vessel was an inlet and an outlet. A gaseous mixture of 80% nitrogen and 20% oxygen was injected into the inlet at a flow of 10 liters per minute. The gaseous mixture and the mist (fog) exited the plastic vessel via the outlet. Attached to the outlet was a pyrex tube which directed the gaseous mixture/mist (fog) combination towards a heated substrate. The heated substrate was located about 25 millimeters from the end of the pyrex tube. The substrate consisted of a strontium titanate ($SrTiO_3$) single crystal 3 millimeters wide by 10 millimeters long by 0.5 millimeters thick. The crystal was cut with the (001) crystal face parallel to the plane formed by the 3 millimeter width and 10 millimeter length. The substrate was attached to a copper block with "silver paste." The copper block was heated to a temperature of about 600° C.-630° C. The gaseous mixture/mist (fog) combination formed a dense precursor film on the substrate. The deposition time was one hour and the final precursor film thickness was 1 micrometer. About 20 milliliters of solution was consumed.

The Y:Ba:Cu stoichiometry of the resulting precursor film was 1:2:3 to within about 5% accuracy. Note that the starting salt solution Y:Ba:Cu ratio was not 1:2:3 but in the ratio of 1:2:0.5. It has now been discovered that copper nitrate decomposes more easily than yttrium nitrate and barium nitrate in the temperature range 600° C.-630° C.; and the salt solution stoichiometry must be made copper poor. Depending upon the substrate temperature the initial salt solution cation stoichiometry must be determined by experiment as known to those skilled in the art.

The resulting precursor film was next fluorinated. The precursor film was placed in a quartz tube contained in a tubular furnace. The quartz tube was evacuated using an oil filled rotary vane pump. The tubular furnace was powered on and the precursor film was heated to 600° C. $CF_3CH_2F$ gas and oxygen gas were next admitted into the quartz tube. The $CF_3CH_2F$ gas pressure was 4 Torr and the oxygen gas pressure was 100 milliTorr. The total pressure in the quartz tube was about 4.1 Torr. The precursor film was kept at 600° C. in the $CF_3CH_2F$ oxygen atmosphere for 40 minutes. Xray diffraction revealed the precursor film to be fluorinated. Xray diffraction indicated that the precursor was completely converted to a phase which was identified as barium oxyfluoride.

Next, the fluorinated precursor film was heat treated in a quartz tube at atmospheric pressure. The composition of the atmosphere in the quartz tube consisted of 50 Torr water vapor, 100 millitorr oxygen and balance nitrogen. The heat treating temperature was 735° C. and the film was heat treated for about 3 hours. During heat treating the precursor film was converted into a crystalline $YBa_2Cu_3O_7$ film. The superconducting critical current density ($J_c$) of the resulting crystalline $YBa_2Cu_3O_7$ was measured at 77 K. The film had a $J_c$ of $0.8 \times 10^6$ Ampere/$cm^2$. Examples of the conversion of fluorinated precursor films to crystalline $YBa_2Cu_3O_7$ films using atmospheric heat treating at different water vapor pressures can be found in the publication "High Rate Deposition of 5 Micron Thick $YBa_2Cu_3O_7$ Films Using the $BaF_2$ Ex-Situ Post Annealing Process by IEEE Transactions on Applied Superconductivity," 9(2):1467 (June 1999).

Example 2

Preparation of a YBCO Precursor Film: Fluorination as Precursor Solution is Placed on Substrate An aqueous solution of nitrate salts was fabricated. Ten milliliters of nitric acid was added to 100 milliliters of distilled water. Copper oxide, yttrium oxide and barium carbonate were next dissolved into the nitric acid-water solution. The ratio of Y:Ba:Cu was 1:2:0.5 and the total cation concentration was about 0.01 molar.

The resulting salt solution was added to a closed plastic vessel. The bottom of the vessel was constructed of a 10 mil thick mylar film. The bottom of the plastic vessel was placed in close contact with an ultrasonic crystal oscillating at 1.65 megahertz. The ultrasonic crystal was contained in a Devilbiss Ultra Neb model 99HD nebulizer. The mylar film was coupled to the ultrasonic crystal with water, a technique known to those skilled in the art. Power was applied to the ultrasonic crystal and a fine mist (fog) filled the plastic vessel. At the top of the plastic vessel was an inlet and an outlet. A gaseous mixture was injected into the inlet. The gases consisted of 80% nitrogen and 20% oxygen at a flow of 10 liters per minute and $CF_3CH_2F$ at a flow of 0.3 liters per minute. The resulting gaseous mixture and the mist (fog) exited the plastic vessel via the outlet. Attached to the outlet was a pyrex tube which directed the gaseous mixture/mist combination towards a heated substrate. The heated substrate was located about 25 millimeters from the end of the pyrex tube. The substrate consisted of a strontium titanate ($SrTiO_3$) single crystal 3 millimeters wide by 10 millimeters long by 0.5 millimeters thick. The crystal was cut with the (001) crystal face parallel to the plane formed by the 3 millimeter width and 10 millimeter length. The substrate was attached to a copper block with 'silver paste'. The copper block was heated to a temperature of about 600° C.-630° C. The gaseous mixture/mist combination formed a dense precursor film on the substrate. The deposition time was one hour and the final precursor film thickness was 1 micrometer.

The Y:Ba:Cu stoichiometry of the resulting precursor film was 1:2:3 to within about 5% accuracy. Xray diffraction revealed the precursor film to be fluorinated. Xray diffraction indicated that the precursor was converted to a phase we identified as barium oxyfluoride.

Example 3

Preparation of a YBCO Precursor Film Using Corona Discharge: Fluorination After Precursor Solution Was Placed on Substrate An aqueous solution of nitrate salts was fabricated. Ten milliliters of nitric acid was added to 100 milliliters of distilled water. Copper (II) oxide, yttrium oxide and barium carbonate were dissolved into the nitric acid-water solution. The ratio of Y:Ba:Cu was 1:2:3.5 and the total cation concentration was about 0.05 molar. Note that the starting salt solution Y:Ba:Cu ratio was not 1:2:3 but in the ratio of 1:2:3.5. It has now been discovered that copper nitrate decomposes less easily than yttrium nitrate and barium nitrate at a substrate temperature of about 650° C. in the presence of a corona discharge and the salt solution stoichiometry must be made copper rich. Depending upon the substrate temperature the initial salt solution cation stoichiometry in the presence of a corona discharge must be determined by experiment as known to those skilled in the art.

The resulting solution was transferred into the closed plastic vessel as described in the Example 1; and power was applied to the ultrasonic crystal creating a mist in the plastic vessel above the solution. A gaseous mixture was injected into the inlet of the plastic vessel. The gaseous mixture consisted of 80% nitrogen and 20% oxygen at a flow of 13 liters per minute. Attached to the outlet was a pyrex tube which directed the gaseous mixture/mist combination towards a heated substrate located about 25 millimeters from the end of the pyrex tube. The substrate was a strontium titanate ($SrTiO_3$) single crystal 3 millimeters wide by 10 millimeters long by 0.5 millimeters thick and heated to a temperature of 630° C. A metal tip fabricated from copper wire 0.1 millimeters in diameter was placed 5 millimeters from the end of the pyrex tube attached to the outlet of the plastic vessel. A voltage of 25 kilovolts was applied to the copper wire during the time the gaseous mixture/mist was impinging upon the substrate. A Corona discharge was observed at the tip of the copper wire and the discharge current was 20-30 microamperes. A precursor film 1 micrometer thick was formed on the substrate in 10 minutes.

The precursor film was next fluorinated in the manner described in Example 1. The precursor film was placed in a quartz tube contained in a tubular furnace. The quartz tube was evacuated using an oil filled rotary vane pump. The tubular furnace was powered on and the precursor film was heated to 600° C. $CF_3CH_2F$ gas and oxygen gas were next admitted into the quartz tube. The $CF_3CH_2F$ gas pressure was 4 Torr and the oxygen gas pressure was 100 milliTorr. The precursor film was kept at 600° C. in the $CF_3CH_2F$ oxygen atmosphere for 35 minutes. Xray diffraction revealed the precursor film to be fluorinated. Xray diffraction indicated that the precursor was completely converted to a phase which was identified as barium oxyfluoride.

Next, the fluorinated precursor film was heat treated in a quartz tube at atmospheric pressure. The composition of the atmosphere in the quartz tube consisted of 50 Torr water vapor, 100 millitorr oxygen and balance nitrogen. The heat treating temperature was 735° C. and the film was heat treated for about 3 hours. During heat treating the precursor film was converted into a crystalline $YBa_2Cu_3O_7$ film. The superconducting critical current density ($J_c$) of the resulting crystalline $YBa_2Cu_3O_7$ was measured at 77 K. The film had a $J_c$ of $0.6 \times 10^6$ Ampere/cm$^2$.

Example 4

Use of HFC 134a ($CF_3CH_2F$) Gas to Improve the Quality of Precursor Films

HFC 134a ($CF_3CH_2F$) gas is used to improve the quality of precursor films made by prior art methods. Two precursor films, comprising a mixture of $BaF_2$, Y and Cu were deposited onto $SrTiO_3$ substrates. The films were fabricated by co-evaporating $BaF_2$, Y and Cu in a vacuum chamber. The Y and Cu were deposited using electron beam guns and the $BaF_2$ by thermal evaporation. Details of the evaporation technique can be found in Solovyov et al., "Thick $YBa_2Cu_3O_7$ films by post annealing of the precursor by high rate e-beam deposition on SrTiO3 substrates" Physica C. 309: 269 (1998). The resulting films were 0.6 microns thick. One film was heat treated at 600° C. for one hour in an atmosphere consisting of 5 Torr of $CF_3CH_2F$ gas and 100 millitorr of oxygen. The second film was not heat treated.

Next, both films were heat treated at 735° C. at one atmosphere pressure in order to convert the precursor films in crystalline $YBa_2Cu_3O_7$ films. The atmosphere consisted of 50 Torr water vapor, 100 millitorr oxygen and balance nitrogen. The film that was first heat treated in the presence of the $CF_3CH_2F$ gas had a critical current of $1.6 \times 10^6$ ampere/cm$^2$ compared to a critical current of $1.1 \times 10^6$ ampere/cm$^2$ for the film that was not heated treated in $CF_3CH_2F$ gas.

Example 5

Use of HFC 134a ($CF_3CH_2F$) Gas to Inhibit Precursor Films from Becoming Crystalline.

The presence of $CF_3CH_2F$ gas inhibits and/or reverses the conversion of a YBCO fluorinated precursor film into a crystalline $YBa_2Cu_3O_7$ film. A precursor film, consisting of a mixture of $BaF_2$, Y and Cu was deposited onto a $SrTiO_3$ substrate. The film was fabricated by co-evaporating $BaF_2$, Y and Cu in a vacuum chamber as described in Example 4. The resulting precursor film was 2 microns thick. The precursor film was heat treated in a quartz tube at subatmospheric pressure. The total pressure was 7 Torr and the composition of the atmosphere consisted of 2 Torr water vapor, 100 milliTorr oxygen and balance nitrogen. The heat treating temperature was 735° C. During heat treating, the precursor film was being converted into a crystalline $YBa_2Cu_3O_7$ film as determined by monitoring the conductivity of the film. Details of the technique used to measure the conductivity and the relationship of film conductivity to crystallinity can be found in Solovyov et al., "High Rate Deposition of 5 Micron Thick $YBa_2Cu_3O_7$ Films Using the $BaF_2$ Ex-Situ Post Annealing Process by IEEE Transactions on Applied Superconductivity," 9(2):1467 (June 1999). During the course of heat treating a small amount of HFC 134a ($CF_3CH_2F$), approximately 10 milliTorr, was added to the atmosphere in the quartz tube. It was observed that approximately 10 milliTorr of HFC 134a gas was sufficient to stop the conversion of the precursor film into crystalline $YBa_2Cu_3O_7$. Higher HFC 134a gas pressures were sufficient to convert crystalline $YBa_2Cu_3O_7$ back into a precursor like film.

Thus, while there have been described the preferred embodiments of the present invention, those skilled in the art will realize that other embodiments can be made without departing from the spirit of the invention, and it is intended to include all such further modifications and changes as come within the true scope of the claims set forth herein.

We claim:

1. A method of making a crystalline superconducting ceramic, said method comprises:
   a) providing a solution comprising a rare earth salt, an alkaline earth metal salt and a copper salt;
   b) placing said solution onto a substrate to provide a precursor-covered substrate;
   c) heating said precursor-covered substrate in an atmosphere containing fluorinated gas to provide a fluorinated precursor wherein the fluorinated gas comprises at least one hydrofluorocarbon, and wherein the precursor is substantially non-superconducting and;

d) transforming the fluorinated precursor into a crystalline superconducting ceramic, wherein the crystalline superconducting ceramic contains only trace amounts of fluorine.

2. A method according to claim 1 wherein said solution has a pH in the range of approximately 1 to 5.

3. A method according to claim 1 further comprising dispersing said solution in a carrier gas before placing said solution on said substrate, wherein said carrier gas comprises an inert gas.

4. A method according to claim 3 wherein said inert gas is selected from the group consisting of nitrogen, argon, helium and mixtures thereof.

5. A method according to claim 3 wherein said carrier gas further comprises oxygen.

6. A method according to claim 1 further comprising heating said substrate before placing said solution on said substrate.

7. A method according to claim 1 wherein said rare earth salt is selected from the group consisting of a yttrium (Y) salt, a neodymium (Nd) salt, a, a ytterbium (Yb) salt, an europium (Eu) salt, a gadolinium (Gd) salt, a dysprosium (Dy) salt, a holmium (Ho) salt, an erbium (Er) salt, a lanthanum (La) salt, a lutetium (Lu) salt, a samarium (Sm) salt, a thulium (Tm) salt, and mixtures thereof.

8. A method according to claim 7 wherein said rare earth salt is a yttrium (Y) salt.

9. A method according to claim 7 wherein said rare earth salt is selected from the group consisting of a rare earth nitrate, a rare earth acetate and mixtures thereof.

10. A method according to claim 7 wherein said rare earth salt is selected from the group consisting of a rare earth sulfate, a rare earth chloride, a rare earth bicarbonate and mixtures thereof.

11. A method according to claim 1 wherein said salt of an alkaline earth metal is selected from the group consisting of a strontium (Sr) salt and a barium (Ba) salt and mixtures thereof.

12. A method according to claim 11 wherein said salt of an alkaline earth metal is a barium (Ba) salt.

13. A method according to claim 12 wherein said barium (Ba) salt is selected from the group consisting of a barium nitrate, a barium acetate and mixtures thereof.

14. A method according to claim 12 wherein said barium salt is selected from the group consisting of a barium sulfate, a barium chloride and mixtures thereof.

15. A method according to claim 1 wherein said copper salt is selected from the group consisting of a copper nitrate, a copper acetate and mixtures thereof.

16. A method according to claim 1 wherein said copper salt is selected from the group consisting of a copper sulfate, a copper sulfide, a copper chloride and mixtures thereof.

17. A method according to claim 1 wherein said substrate is selected from the group consisting of a single crystalline ceramic, polycrystalline ceramic, a single crystal and a metal substrate.

18. A method according to claim 17 wherein said substrate is selected from the group consisting of $SrTiO_3$, $LaAlO_3$, zirconia, $CeO_2$, $Y_2O_3$, MgO, and $SrRuO_3$.

19. A method according to claim 17 further comprising placing a buffer layer on said metal substrate before placing said solution.

20. A method according to claim 1 wherein said fluorinated gas is selected from the group consisting of $CHF_3$, $CH_2F_2$, $CH_3F$, $CHF_2CHF_2$ (HFC 134), $CHF_2CF_3$ (HFC 125), $CHF_2CH_3$ (HFC 152a), $CF_3CH_2F$ (HFC 134a), $CH_3CF_3$, $CH_2FCH_3$, $CHF_2CH_2F$, $CH_2FCH_2F$, $CF_3CH_2CF_3$ (HFC 236fa), a fluorinated propane, a fluorinated propylene, a fluorinated ethylene and mixtures thereof.

21. A method according to claim 1 wherein said fluorinated gas comprises $CF_3CH_2F$ (HFC 134a).

22. A method according to claim 1 wherein said solution comprises Y, Ba and Cu in a ratio of 1:2:0.5.

23. A method according to claim 1 further comprising subjecting said solution to a high voltage Corona discharge before or during the placing of said solution on said substrate.

24. A method according to claim 23 wherein said solution comprises Y, Ba and Cu in a ratio of 1:2:3.5.

25. A method according to claim 1 where said atmosphere containing fluorinated gas is subject to a high voltage electrical discharge.

* * * * *